United States Patent [19]

Poon et al.

[11] Patent Number: 5,064,683
[45] Date of Patent: Nov. 12, 1991

[54] METHOD FOR POLISH PLANARIZING A SEMICONDUCTOR SUBSTRATE BY USING A BORON NITRIDE POLISH STOP

[75] Inventors: Stephen S. Poon; Avgerinos V. Gelatos, both of Austin, Tex.

[73] Assignee: Motorola, Inc., Schaumburg, Ill.

[21] Appl. No.: 604,855

[22] Filed: Oct. 29, 1990

[51] Int. Cl.$^5$ ............................................... B05D 3/06
[52] U.S. Cl. .................................... 427/39; 427/255.2; 427/255.7; 427/355; 51/281 R; 51/310
[58] Field of Search .................... 51/326, 281 R, 310; 264/162; 437/225; 427/34, 248.1, 264, 39, 255.7, 355, 255.2; 501/96

[56] References Cited

U.S. PATENT DOCUMENTS

| | | | |
|---|---|---|---|
| 4,627,991 | 12/1986 | Seki et al. | 427/39 |
| 4,671,851 | 6/1987 | Beyer et al. | 156/645 |
| 4,789,648 | 12/1988 | Chow et al. | 437/225 |
| 4,910,155 | 3/1990 | Cote et al. | 437/8 |
| 4,944,836 | 7/1990 | Beyer et al. | 156/645 |

OTHER PUBLICATIONS

"Properties of the B-Si-N Ceramic Thin Films by Plasma-CVD" Takahiro Nakahigashi et al., Shinku (Vacuum), vol. 31, No. 9, pp. 789-795 (1988) Translation provided.

Primary Examiner—Shrive Beck
Assistant Examiner—Benjamin L. Utech
Attorney, Agent, or Firm—Jasper W. Dockrey; Robert L. King

[57] ABSTRACT

In a polish palnarization process using a polishing apparatus and an abrasive slurry, a boron nitride (BN) polish stop layer (18) is provided to increase the polish selectivity. The BN layer deposited in accordance with the invention has a hexagonal-close-pack crystal orientation and is characterized by chemical inertness and high hardness. The BN layer has a negligible polish removal rate yielding extremely high polish selectivity when used as a polish stop for polishing a number of materials commonly used in the fabrication of semiconductor devices. In accordance with the invention, a substrate (12) is provided having an uneven topography including elevated regions and recessed regions. A BN polish stop layer (18) is desposited to overlie the substrate (12) and a fill material (20, 36) which can be dielectric material or a conductive material, is deposited to overlie the BN polish stop (18) and the recessed regions of the substrate. The fill material is then polished back until the BN polish stop is reached resulting in the formation of a planar surface (38).

11 Claims, 2 Drawing Sheets

METHOD FOR POLISH PLANARIZING A SEMICONDUCTOR SUBSTRATE BY USING A BORON NITRIDE POLISH STOP

FIELD OF THE INVENTION

This invention relates in general to a method for fabricating a semiconductor device, and more particularly to a method for polish planarizing a semiconductor substrate with an improved polish stop.

BACKGROUND OF THE INVENTION

In order to build faster and more complex integrated circuits, semiconductor manufacturers have increased the number of components in the integrated circuit while reducing the overall size of the circuit. The small circuit size requires multiple overlying conductive layers to electrically interconnect the vast number of components within the integrated circuit. As successive layers of conductors and dielectric materials are deposited over previously defined structures, the surface topography can become uneven. To be manufactured reliably, the conductive layers need to be deposited, and an interconnect pattern defined on a smooth, planar surface. A planarization process is typically performed after the deposition of a dielectric passivation layer to reduce the topographic contrast of the passivation layer. A conductive layer is then deposited on a smooth, even surface and the interconnect pattern reliably defined using conventional photolithography.

One method for planarizing the substrate surface during integrated circuit fabrication is a polish planarization process. Recently, polishing processes have been developed which abrasively removed elevated portions of a passivation layer overlying an uneven substrate. In this process, known as chem-mech polishing, the passivated surface of the substrate is brought into contact with a rotating polish pad in the presence of an abrasive slurry. A portion of the passivation layer is then abrasively removed by the mechanical action of the polish pad and the chemical action of the slurry. The slurry serves to lubricate the surface and contains a fill material such as silica to provide additional abrasive force. Additional chemicals are sometimes added to the slurry to adjust the pH and to chemically etch the surface of the layer to be polished. See for example, U.S. Pat. No. 4,910,155 to W. Cote. Wafer polishing has the advantage of being very versatile and not limited by the particular material being polished. The polishing technique can also be used to remove irregularities from the surface of a silicon substrate.

A common requirement of all polishing processes is that the substrate be uniformly polished. In the case of polishing back a passivation layer, it is desirable to polish the layer uniformly from edge to edge on the substrate. To insure that a planar surface is obtained, the passivation layer overlying elevated surface regions must be uniformly removed. Uniform polishing can be difficult because, typically, there is a strong dependence in the polish removal rate with localized variations in the surface topography of the substrate. For example, in substrate areas having a high degree of surface variation, such as areas having closely spaced adjacent trenches, the polishing rate is higher than in areas lacking a high degree of surface contrast, such as areas having large active device regions. The effect of surface topography on the removal rate requires the polishing time to be extended beyond that required to just remove the passivation layer from the most elevated regions. However, the polish time cannot be extended indefinitely or layers underlying the passivation layer can be damaged. The polish selectivity can be defined as the ratio of the removal rate of an overlying layer to that of an underlying layer. The polish selectivity must be maximized in order to improve the edge to edge polish rate uniformity and the ultimate ability of the polish process to form a planar surface. One technique used to increase polishing selectivity, described in U.S. Pat. No. 4,944,836 to K. Beyer, adjusts the composition and pH of the slurry solution depending upon the polish characteristics of the particular material to be polished and the underlying layer. More commonly, a hard, thin film referred to as a polish stop layer is deposited to overlie the uneven surface of the substrate prior to depositing the passivation layer. The polish stop layer underlying the passivation layer is more resistant to abrasive removal than the passivation layer. During polishing, when the polish stop overlying the most elevated surface regions of the substrate is exposed, the removal rate of material from the substrate declines and ideally stops altogether as all of the elevated portions of the polish stop layer become exposed. If the polish stop material is sufficiently resistant to abrasive removal and chemically unreactive with the components in the slurry, the polishing time can be extended for a long enough period to uniformly polish the passivation layer without damaging underlying layers.

While potentially offering wide versatility and a high degree of uniformity, the polish process must be controlled to avoid damaging underlying layers. Although previous investigators have adjusted various elements of the polishing process to increase the polish selectivity, such as the slurry composition and the polish pad material, the preferred method remains the use of a polish stop layer. A variety of polish stop materials have been reported including silicon nitride, alumina and magnesium oxide with silicon nitride being the most widely used. For example, the use of silicon nitride is described in U.S. Pat. No. 4,671,851 to K. Beyer et al. The polish stop material must be chemically inert, have high hardness and have deposition and removal characteristics which are compatible with existing process techniques. While materials such as silicon nitride and alumina are well characterized and widely used in semiconductor fabrication, they lack the necessary characteristics needed for a highly selective polish process.

BRIEF SUMMARY OF THE INVENTION

In practicing the present invention there is provided a method for forming a BN polish stop layer in which the BN has a hexagonal-close-pack crystal orientation. The BN layer has a negligible polish removal rate yielding extremely high polish selectivity when used as a polish stop for polishing a number of materials commonly used in the fabrication of semiconductor devices. In accordance with the invention, a substrate is provided having an uneven topography including elevated regions and recessed regions. A BN polish stop layer is deposited to overlie the elevated regions and a fill material is deposited to overlie the BN polish stop and the recessed regions of the substrate. The fill material is polished back until the BN polish stop is reached forming a planar surface.

Figure 1:
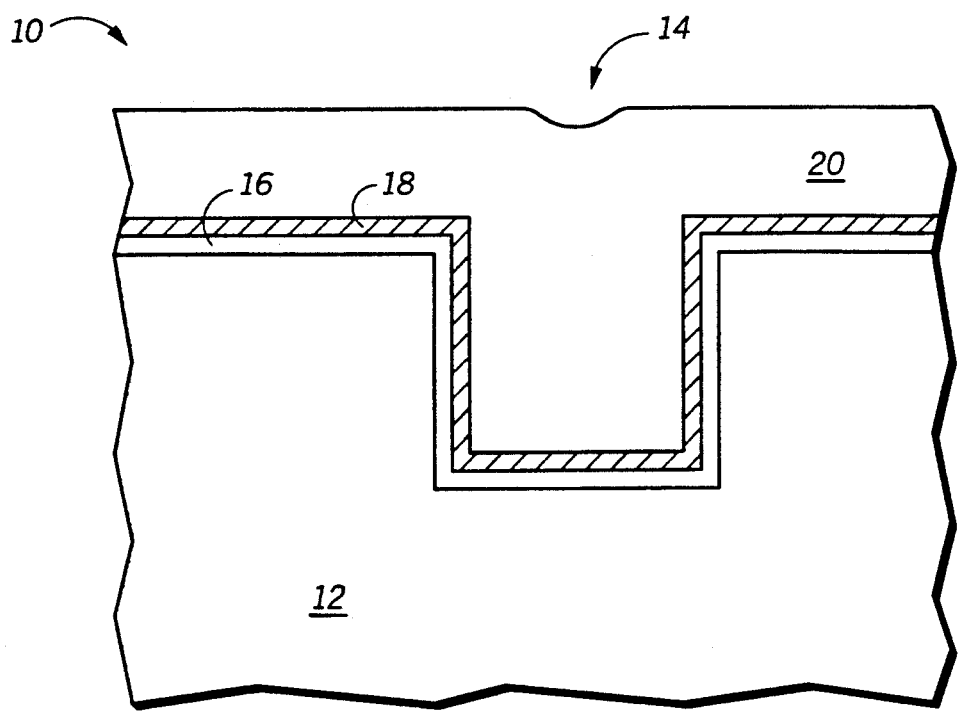
FIGS. 1 and 2 illustrate, in cross section, one embodiment of a planarization process in accordance with the invention.

It will be appreciated that for simplicity and clarity of illustration elements shown in the FIGURES have not necessarily been drawn to scale. For example, the dimensions of some of the elements are exaggerated relative to each other for clarity. Further, where considered appropriate, reference numerals have been repeated among the FIGURES to indicate corresponding elements.

DETAILED DESCRIPTION OF A PREFERRED EMBODIMENT

In a search for suitable semiconductor materials that can be polished to form a planar surface, it has been discovered that boron nitride (BN) forms an excellent polish stop having very good adhesiveness to silicon and dielectric materials, such as silicon dioxide. The boron nitride can be easily deposited, preferably by plasma-enhanced-chemical-vapor-deposition (PECVD), or alternatively, by thermal chemical-vapor-deposition (CVD), to form a continuous layer of high hardness on the surface of a substrate. The selected PECVD deposition conditions produce a BN film having a hexagonal-close-pack crystal orientation similar to that of graphite. Despite the well known softness characteristics of graphite, the BN film deposited in accordance with the invention is characterized by substantial resistance to abrasive and chemical removal during a polishing process. The development of a polish stop material that is both chemically unreactive with many polish slurry compositions and of high hardness, greatly increases the utility of a polishing process used during semiconductor device fabrication.

The BN material used to form a polish stop layer is preferably deposited onto a semiconductor substrate in a PECVD reactor such as a Plasma III system manufactured by ASM of Phoenix, Arizona. The deposition is carried out by flowing about 100 to 250 standard-cubic-centimeters-per-minute (SCCM) of diborane ($B_2H_6$), about 500 to 1500 SCCM of ammonia ($NH_3$) and about 3000 to 5000 SCCM of a carrier gas such as argon (Ar) into the reactor. A total gas pressure of about 1 to 3 Torr is maintained and a plasma is created by applying about 1500 to 2000 Watts of RF power to the anode located within the reactor chamber. A substrate temperature of about 250° to 400° C. is maintained during the deposition.

Infra-Red (IR) spectrographic analysis of BN formed using the reactor conditions given above indicates the BN film has a hexagonal-close-pack crystal orientation. It has also been found that at a higher substrate temperature and RF power, BN having a cubic crystal orientation is obtained. While the cubic form of BN possesses high hardness, it does not have the desirable adhesive properties of the hexagonal-close-pack form of BN. Experiments carried out to determine film characteristics of hexagonal BN deposited on a silicon substrate have shown hexagonal BN to have high hardness and to adhere strongly to silicon. In addition, the hexagonal BN film is substantially unreactive with common chemical etchants such as hydrofluoric acid (HF) and phosphoric acid ($H_3PO_4$).

A particular advantage of the forming a hexagonal BN layer in accordance with the invention is the relatively low deposition temperature used during the deposition process. The deposition temperature at which hexagonal BN is deposited is sufficiently low such that unwanted thermally catalyzed dopant diffusion and material deformation are avoided. For example, in the 250° to 400° C. deposition range of hexagonal BN, the diffusion of dopants previously introduced into the semiconductor substrate will not occur. Furthermore, at the deposition temperature of hexagonal BN, materials having low thermal tolerances, such as aluminum or aluminum-silicon alloys will not soften. In contrast, a deposition temperature of about 600° to 900° C. is necessary to deposit cubic BN which is detrimental to aluminum conductors and can induce dopant diffusion. The low deposition temperature of the hexagonal BN polish stop layer thus enables the use of a polishing process at various stages in a semiconductor fabrication process including after the formation of doped regions and metal interconnects.

Typically, in a fabrication process in which a planarization step is to be used, the substrate has an uneven surface topology characterized by recessed regions and elevated regions. Once the BN polish stop is deposited onto a substrate surface, one or more layers to be planarized are deposited to overlie the BN polish stop. The polishing operation is then preferably carried out in a polishing apparatus having a rotating polish wheel with a polyurethane polishing pad disposed thereon. One such commercially available polishing apparatus is the "Westech 372" manufactured by Westech Inc. of Phoenix, Ariz. A commercially available slurry comprised of colloidal silica suspended in potassium hydroxide (KOH) is applied to the polishing pad and the one or more layers overlying the BN are removed until the BN layer is reached. Upon exposure of the BN layer, the removal of any remaining portions of the substrate, and layers thereon, ceases resulting in a smooth planar surface.

The removal rate of hexagonal BN deposited using the PECVD process previously described has been measured and compared with other materials commonly used in semiconductor device fabrication. Under standard polishing conditions and a pad pressure ranging from 3 to 10 pounds-persquare-inch (psi), a negligible removal rate of BN polish stop has been observed. The other polishing conditions are summarized as follows: platen temperature of 38° C.; 15 rpm platen speed; slurry flow rate about 175 SCCM, (Cabot SC1 slurry manufactured by Nalco Chemical Co.); 35 rpm carrier speed; Suba4/IC60 polish pad, manufactured by Rodel Products Corp. of Scottsdale, Ariz. Following the primary polish, a KOH and deionized water rinse solution is applied at a secondary platen. The removal rates for various materials at pad pressures of 5 and 7 psi and polishing times of 3 min. were determined by film thickness measurements using a Nanospec AFT optical interferometer manufactured by Nanospec Inc. The results are presented in Table I.

TABLE I

| MATERIAL | PAD PRESSURE (PSI) | REMOVAL RATE (NM/MIN) |
|---|---|---|
| LTO | 5 | 79 |
| LTO | 7 | 103 |

TABLE I-continued

| MATERIAL | PAD PRESSURE (PSI) | REMOVAL RATE (NM/MIN) |
|---|---|---|
| POLYSILICON | 5 | 147 |
| POLYSILICON | 7 | 194 |
| BPSG | 5 | 174 |
| TiN | 5 | 28 |
| SI$_3$N$_4$ | 5 | 15 |
| BN | 5 | * |

*less than detection limit of measurement instrument (+/−0.2 NM)

The data presented in Table I clearly show that BN, deposited in accordance with the invention, is of sufficient hardness to withstand an abrasive polish removal process. It is apparent from the experimental data given in Table I that BN has a much slower removal rate than many materials commonly used to fabricate semiconductor devices. The materials LTO (low temperature oxide), BPSG and Si$_3$N$_4$ (silicon nitride) are commonly used to provide electrical insulation. Polysilicon and TiN (titanium nitride) are commonly used to form conductive elements. In addition, Si$_3$N$_4$ (silicon nitride) and TiN (titanium nitride) have been used as polish stop layers in the prior art. The negligible removal rate of the BN polish stop has the practical significance of yielding an extremely high removal selectivity to overlying fill materials such as those listed in Table I.

The selectivity in a polishing operation is determined by the ratio of the removal rate of an overlying fill material to that of the polish stop material. For example at a pad pressure of 5 psi, this computation yields values ranging from 3.6 to 11.4 for a Si$_3$N$_4$ polish stop supporting the fill materials listed in Table I. Conversely, the same selectivity values computed for BN yield a substantially larger value, further illustrating the superior polish process results which are attainable with a BN polish stop layer deposited in accordance with the invention.

It is expected that the process of the invention will be applicable to a number of device structures and fabrication processes where it is desirable to form a planarized surface. Without further elaboration, it is believed that one skilled in the art can, using the preceding description, utilize the invention to its fullest extent. The following preferred specific embodiments are, therefore, to be construed as merely illustrative, and not limitative of the remainder of the disclosure in any way whatsoever.

EXAMPLE I

FIG. 1 illustrates, in cross section, a semiconductor device structure 10 formed in accordance with one embodiment of the invention. Device structure 10 includes a substrate 12 which can be a semiconductor or an insulating body having a recess 14 formed therein. A dielectric layer 16 overlies the surface of substrate 12 and recess 14. A BN polish stop layer 18 overlies dielectric layer 16 and separates dielectric layer 16 from a fill material 20 overlying polish stop layer 18. Fill material 20 can be a dielectric material such as LTO deposited using tetraethoxysilane (TEOS), silicon oxide doped with phosphorus (PSG), silicon oxide doped with boron and phosphorus (BPSG) and the like. Alternatively, fill material 20 can be a semiconductor material such as polysilicon doped with either phosphorus or boron, a conductive material refractory metal such as tungsten, titanium, molybdenum, cobalt and silicides thereof, and the like. In the case where fill material 20 is a dielectric material, recess 14 forms an isolation trench structure electrically isolating two or more active device regions in substrate 12. Such a structure may occur, for example, in the fabrication of MOS SRAM and DRAM devices or microprocessor devices which include EPROM or EEPROM memory arrays, or other devices using trench isolation structures such as bipolar and BiCMOS devices. In the case where fill material 20 is a conductive or semiconductor material, recess 14 forms a trench capacitor and substrate 12 forms one capacitor plate while fill material 20 forms the other capacitor plate and dielectric layer 16 and polish stop layer 18 form a capacitor dielectric. While not necessarily depicting any particular semiconductor device structure, device structure 10 serves to illustrate the application of the invention to the fabrication of a semiconductor device.

Figure 2:
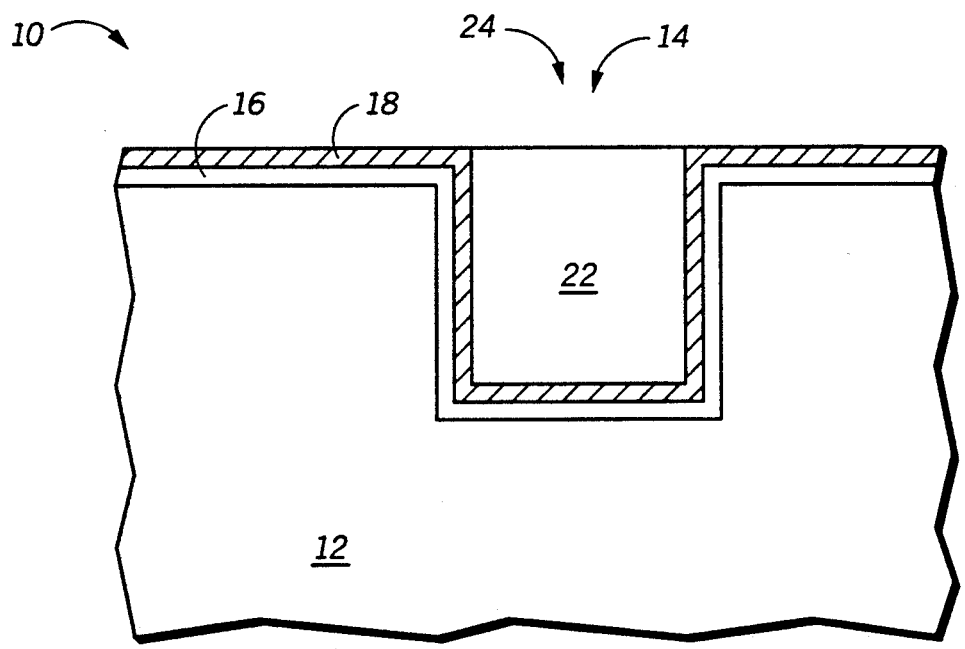

Device structure 10 is planarized by placing the structure in a polishing apparatus wherein fill material 20 is polished back until polish stop layer 18 is reached, as shown in FIG. 2. The polishing operation forms a smooth planar surface with a highly uniform flatness. The high polish selectivity obtainable with BN permits the polishing operation to be extended beyond the point where the BN layer is first exposed. The polish time can be extended for a sufficient amount of time to remove all portions of fill material 20 protruding above the plane of polish stop layer 18. After polishing back fill material 20, substrate 12 is cleaned in a conventional chemical cleaning process such as a solution of hydrogen peroxide and ammonium hydroxide followed by a solution of hydrochloric acid, hydrogen peroxide and water, in turn followed by a solution of sulfuric acid and hydrogen peroxide, or a variation thereof. Upon completion of polishing and cleaning, a device element 24 has been formed comprising a plug 22 substantially filling recess 14 and separated from substrate 12 by dielectric layer 16 and polish stop layer 18. As previously described, depending upon the particular material forming plug 22, device element 24 can be either a trench isolation structure or a trench capacitor.

EXAMPLE II

Figure 3:
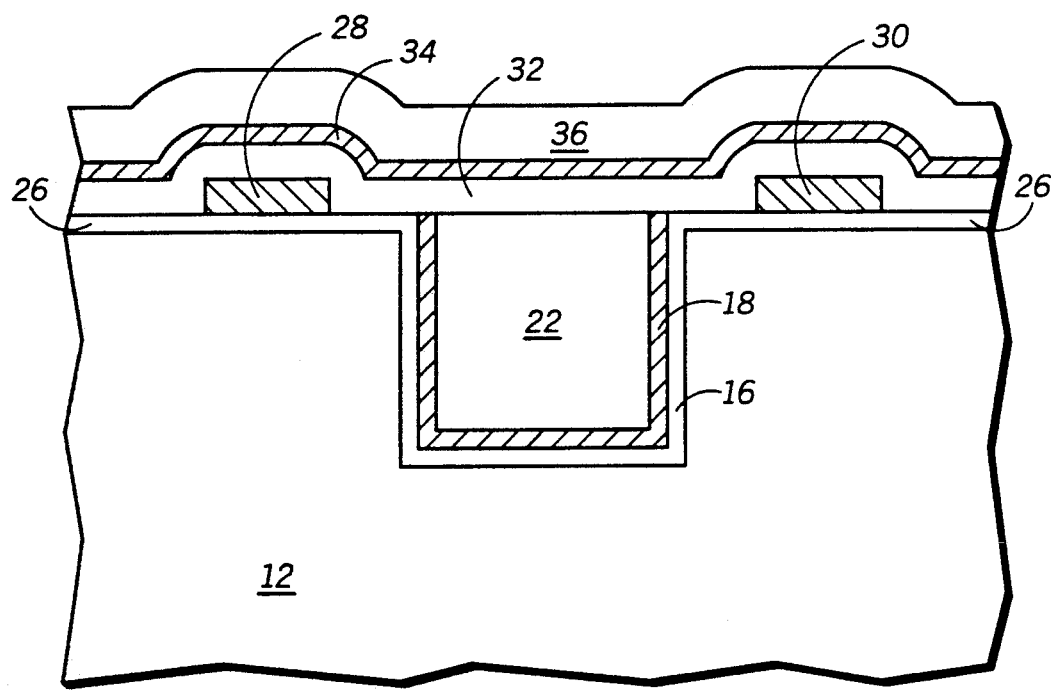
FIGS. 3 and 4 illustrate, in cross section, another embodiment of a planarization process in accordance with the invention.

FIG. 3 shows the cross sectional view of device structure 10, illustrated in FIG. 2, after further processing. Portions of polish stop layer 18 overlying the principle surface of substrate 12 are removed using a reactive ion etch process employing CHF$_3$ and O$_2$ etch gases. Portions of dielectric layer 16 underlying the removed portions of polish stop layer 18 can also be removed by the CHF$_3$ and O$_2$ reactive ion etch, or alternatively, by another oxide etching method such as a buffered hydrofluoric acid (BOE) chemical etch. A gate dielectric layer 26 is formed on the principal surface of substrate 12. Gate dielectric layer 26 can be a thermally grown silicon oxide or a silicon oxide-silicon nitride (ONO) composite layer formed by thermal oxidation of substrate 12 followed by silicon nitride deposition and a second thermal oxidation. Transistor gate electrodes 28 and 30 are formed on gate dielectric layer 26 and a passivation layer 32 is deposited to overlie gates 28 and 30 and plug 22. Passivation layer 32 can be LTO or a doped silicate glass such as PSG, BPSG and the like.

After passivation layer 32 is formed, a second BN polish stop layer 34 is deposited to overlie passivation layer 32. The low deposition temperature used during the formation of second polish stop layer 34 will not cause the underlying passivation layer to flow or otherwise thermally deform. Following the deposition of second polish stop layer 34, a planarization layer 36 is deposited to overlie second polish stop layer 34. Planarization layer 36 can be PECVD deposited $Si_3N_4$, or alternatively, a glass layer such as LTO, PSG, BPSG and the like.

Figure 4:
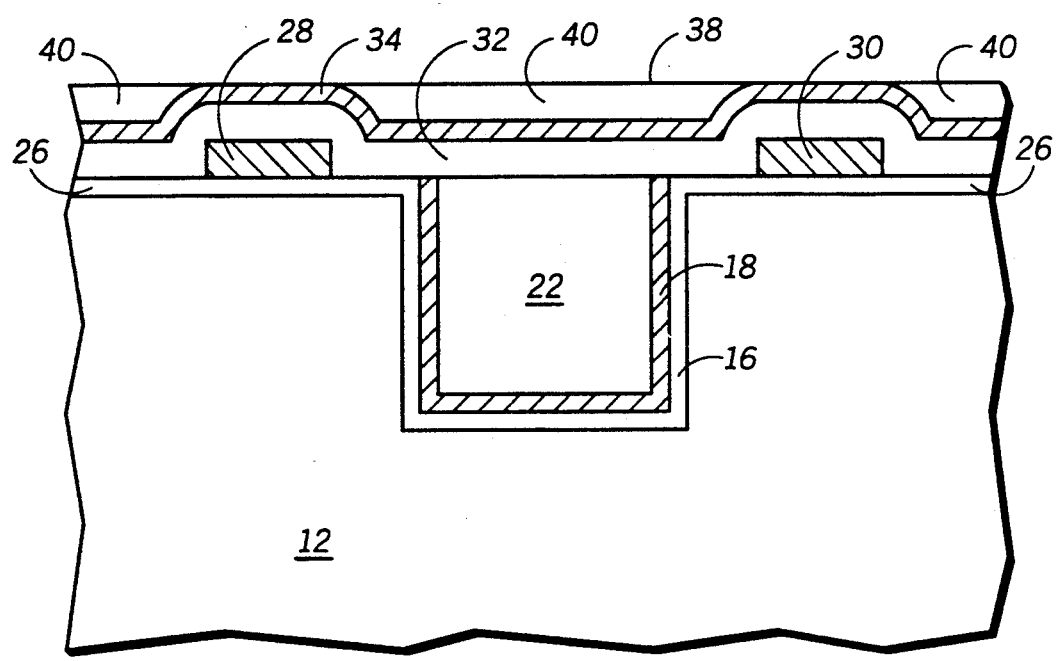

Next, a polishing operation is performed to polish back planarizing layer 36 to form a smooth planar surface 38, as shown in FIG. 4. The polishing step leaves portions 40 of planarization layer 36 in recessed areas below the most elevated portions of second polish stop 34. Because of the low polish removal rate of second polish stop layer 34, the polishing operation can be continued as long as necessary to remove all protruding portions of planarization layer 36. Planarized surface 38 can now be used to support one or more additional layers whose reliability is improved when formed on a planar surface. For example, via holes can be formed through layers 40, 34 and 32 and a metal interconnection layer deposited on planarized surface 38 to electrically couple various components in device portion 10.

Thus it is apparent that there has been provided, in accordance with the invention, a process for planarizing a substrate which fully meets the advantages set forth above. Although the invention has been described and illustrated with reference to specific illustrative embodiments thereof, it is not intended that the invention be limited to those illustrative embodiments. Those skilled in the art will recognize that variations and modifications can be made without departing from the spirit of the invention. For example, the planarization process disclosed herein can be used with different slurry compositions and polish pad material than those described. It is therefore intended to include within the invention all such variations and modifications as fall within the scope of the appended claims and equivalents thereof.

We claim:

1. A method for polish planarizing a substrate comprising:
   providing a substrate having an uneven topography including elevated regions and recessed regions;
   providing a boron nitride polish stop on the elevated regions by depositing boron nitride on the substrate using chemical vapor deposition at a deposition temperature no greater than substantially four hundred degrees Centigrade;
   depositing a fill material to overlie the boron nitride polish stop and the recessed regions; and
   polishing back the fill material until the boron nitride polish stop is reached.

2. The method of claim 1 wherein the step of providing a boron nitride polish stop comprises plasma enhanced chemical vapor deposition of boron nitride.

3. The method of claim 2 wherein the plasma enhanced chemical vapor deposition is carried out at selected temperature and bias voltage conditions to form boron nitride having a hexagonal-close-pack crystal orientation.

4. The method of claim 1 wherein the step of polishing comprises polishing with a silica based slurry material.

5. The method of claim 1 wherein the fill material is selected from the group consisting of silicon oxide, silicon oxide doped with phosphorus and silicon oxide doped with boron and phosphorus.

6. The method of claim 1 wherein the fill material is selected from the group consisting of polysilicon, tungsten, titanium, molybdenum, cobalt and silicides of tungsten, titanium, molybdenum and cobalt.

7. A method for polishing planarizing a silicon substrate having recessed regions and protruding regions comprising the steps of:
   depositing a boron nitride polish stop layer to overlie the substrate, the boron nitride polish stop layer having a hexagonal-close-pack crystal orientation;
   depositing at least one layer of filler material to overlie the boron nitride polish stop layer wherein the at least one layer of filler material has a polishing removal rate substantially greater than the boron nitride polish stop layer;
   placing the substrate in a polishing apparatus wherein the substrate is brought into contact with a rotating polishing wheel having a polishing pad disposed thereon;
   applying a silica slurry suspended in potassium hydroxide to the polishing pad; and
   polishing back the at least one layer of filler material until the polish stop is reached.

8. The method of claim 7 wherein the boron nitride polish stop layer is deposited by plasma-enhanced-chemical-vapor-deposition (PECVD).

9. A method for forming a polish stop layer in a semiconductor fabrication process comprising:
   placing a semiconductor substrate in a plasma-enhanced-chemical-vapor-deposition (PECVD) reactor;
   heating the substrate to about 250° to 400° C.;
   flowing $B_2H_6$, $NH_3$ and a carrier gas into the PECVD reactor;
   applying about 1500 to 2000 Watts of RF power to an anode within the PECVD reactor;
   maintaining a total pressure of about 1 to 3 Torr within the reactor; and
   depositing a layer of boron nitride (BN) having a hexagonal-close-pack crystal orientation onto the semiconductor substrate.

10. The method of claim 9 wherein the carrier gas is selected from the group consisting of argon, nitrogen and helium.

11. The method of claim 9 wherein the flow rate of $B_2H_6$ is about 100 to 250 SCCM and the flow rate of $NH_3$ is about 500 to 1500 SCCM.

* * * * *